(12) United States Patent
Wang et al.

(10) Patent No.: US 11,404,663 B2
(45) Date of Patent: Aug. 2, 2022

(54) FLEXIBLE DISPLAY PANEL STRUCTURE HAVING OPTICAL CLEAR RESIN IN SPACE FORMED BY QUADRILATERAL ANTI-FLOW BARRIER AND COVER PLATE AND FABRICATING METHOD THEREOF

(71) Applicant: Wuhan China Star Optoelectronics Semiconductor Display Technology Co., LTD., Hubei (CN)

(72) Inventors: Fang Wang, Wuhan (CN); Zhuo Zhang, Wuhan (CN); Wen Han, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 365 days.

(21) Appl. No.: 16/623,050

(22) PCT Filed: Nov. 5, 2019

(86) PCT No.: PCT/CN2019/115733
§ 371 (c)(1),
(2) Date: Dec. 16, 2019

(87) PCT Pub. No.: WO2021/027098
PCT Pub. Date: Feb. 18, 2021

(65) Prior Publication Data
US 2021/0328177 A1    Oct. 21, 2021

(30) Foreign Application Priority Data

Aug. 14, 2019 (CN) .......................... 201910748361.7

(51) Int. Cl.
 *H01L 51/52* (2006.01)
 *H01L 27/32* (2006.01)
 *H01L 51/56* (2006.01)

(52) U.S. Cl.
 CPC ........ *H01L 51/5246* (2013.01); *H01L 27/323* (2013.01); *H01L 51/56* (2013.01); *H01L 2251/5338* (2013.01)

(58) Field of Classification Search
 CPC .......................... H01L 51/5246; H01L 27/323
 See application file for complete search history.

(56) References Cited

U.S. PATENT DOCUMENTS 10,925,160 B1 * 2/2021 Tam ........................ H05K 5/003
2013/0147728 A1 * 6/2013 Lee ........................ G06F 3/0416
                                                                361/679.01

(Continued)

FOREIGN PATENT DOCUMENTS

CN   102991092 A   3/2013
CN   103730067 A   4/2014

(Continued)

*Primary Examiner* — Michael Jung
(74) *Attorney, Agent, or Firm* — Benesch, Friedlander, Coplan & Aronoff LLP

(57) ABSTRACT

A flexible display panel structure and fabricating method thereof. The flexible display panel structure includes a cover plate, a touch panel, an organic light-emitting diode device, and a backplate disposed, which are sequentially disposed, wherein a first optical clear resin fluid glue layer is disposed between the cover plate and the touch panel, and the first optical clear resin fluid glue layer bonds the cover plate to the touch panel, which is beneficial to reduce risk of panel cracking and peeling.

12 Claims, 3 Drawing Sheets

(56) References Cited

U.S. PATENT DOCUMENTS

| | | | |
|---|---|---|---|
| 2016/0103518 A1* | 4/2016 | Yang | G06F 3/0445 |
| | | | 345/173 |
| 2017/0300736 A1* | 10/2017 | Song | G06V 40/1312 |
| 2018/0173028 A1* | 6/2018 | Koppal | G09G 3/3648 |
| 2018/0341290 A1* | 11/2018 | Sim | G06F 3/042 |
| 2018/0356915 A1* | 12/2018 | Yeke Yazdandoost | |
| | | | G06F 3/042 |
| 2020/0150845 A1* | 5/2020 | Inoue | G06F 3/04142 |
| 2021/0083227 A1* | 3/2021 | Her | H01L 27/3248 |

FOREIGN PATENT DOCUMENTS

| | | |
|---|---|---|
| CN | 103950265 A | 7/2014 |
| CN | 204557426 U | 8/2015 |
| CN | 108468691 A | 8/2018 |

\* cited by examiner

FLEXIBLE DISPLAY PANEL STRUCTURE HAVING OPTICAL CLEAR RESIN IN SPACE FORMED BY QUADRILATERAL ANTI-FLOW BARRIER AND COVER PLATE AND FABRICATING METHOD THEREOF

FIELD OF INVENTION

The present invention relates to the field of display technologies, and in particular, to a flexible display panel structure and a fabricating method thereof.

BACKGROUND OF INVENTION

Flexible display panels can be expanded into a larger display screen from a smaller volume because of bending characteristics, such as being foldable and rollable, and thus becomes mainstream of the display market in the future. However, in a flexible display panel structure, film layers used for binding between different devices are limited by the modulus and bending performance of each film layer, which affects the degree of bending of a laminated structure. On the other hand, each film layer has different degrees of stretching and compression due to different laminated levels, where areas with high bending stress usually have risk of panel laminated peeling and cracking between film layers, thereby affecting development of flexible display panels in the field of application.

Technical Problem

Each film layer has different degrees of stretching and compression due to different laminated levels, which areas with high bending stress usually have risk of panel laminated peeling and cracking between film layers.

SUMMARY OF INVENTION

Technical Solution

In fabrication of foldable and rollable displays, it must be ensured that materials used in a laminated structure of panels have a certain bending property. However, since modulus of each film material is very different, in the bending process, each functional film layer is subjected to different degrees of extrusion or stretching, and the greater normal stress or shear stress causes the panels to increase the risk of cracking and peeling.

In order to solve above problems, the present invention provides a flexible display panel structure, including a cover plate; a touch panel; an organic light-emitting diode (OLED) device; and a backplate, wherein a first quadrilateral anti-overflow barrier is disposed between the cover plate and the touch panel, a first optical clear resin (OCR) fluid glue layer is filled in a space formed by the first quadrilateral anti-overflow barrier and the cover plate, and the first OCR fluid glue layer bonds the cover plate to the touch panel.

In at least one embodiment of the invention, the first quadrilateral anti-overflow barrier is a parallelogram anti-overflow barrier, and the flexible display panel structure further includes a second quadrilateral anti-overflow barrier disposed between the touch panel and the OLED device, a second OCR fluid glue layer filled in a space formed by the second quadrilateral anti-overflow barrier and the touch panel, and the second OCR fluid glue layer bonds the touch panel to the OLED device.

In at least one embodiment of the invention, an area of the first OCR fluid glue layer is greater than an area of the second OCR fluid glue layer, and a thickness of the second OCR fluid glue layer is greater than a thickness of the first OCR fluid glue layer.

In at least one embodiment of the invention, the flexible display panel structure further including an optically clear adhesive (OCA) disposed between the OLED device and the backplane to bond the OLED device and the backplate.

In at least one embodiment of the invention, the first quadrilateral anti-overflow barrier and the second quadrilateral anti-overflow barrier are composed of an OCR fluid glue.

In at least one embodiment of the invention, the backing plate is a metal sheet.

In at least one embodiment of the invention, a thickness of the OCA ranges from 10 micrometers to 20 micrometers.

In at least one embodiment of the invention, a thickness of the first OCR fluid glue layer ranges from 3 micrometers to 5 micrometers.

The invention also provides a method of fabricating a flexible display panel structure, including the steps of:

step S1, providing a cover plate;

step S2, printing an anti-overflow barrier, which is performed by an inkjet printing on the cover plate, and the anti-overflow barrier is an optical clear resin (OCR) fluid glue;

step S3, pre-curing, which irradiates the anti-overflow barrier by an ultraviolet rays (UV) to pre-cure the OCR fluid glue on the cover plate;

step S4, bonding a touch panel, which bonds the touch panel to the cover plate having pre-cured OCR fluid glue;

step S5, printing an anti-overflow barrier, which is performed by an inkjet printing on the touch panel, and the anti-overflow barrier is an OCR fluid glue;

step S6, pre-curing, which irradiates the anti-overflow barrier by the UV to pre-cure the OCR fluid glue on the touch panel; and step S7, bonding an organic light-emitting diode (OLED) device, which bonds the OLED device to the touch panel having pre-cured OCR fluid glue.

In at least one embodiment of the invention, an enclosure space formed between the anti-overflow barrier and the cover plate of the step S2 includes a first opening, an enclosure space formed between the anti-overflow barrier and the touch panel of the step S5 includes a second opening, after the pre-curing in the step S6, the fabricating method further includes using an UV to perform a secondary curing on the OCR fluid glue on the cover plate and the OCR fluid glue on the touch panel, then, using an injection method to form a first OCR fluid glue layer in the enclosure space formed between the anti-overflow barrier and the cover plate of the step S2 through the first opening and to form a second OCR fluid glue layer in the enclosure space formed between the anti-overflow barrier and the touch panel of the step S5 through the second opening, then using an OCR as a sealant seals the first opening and the second opening, and cures the sealants using UV.

In at least one embodiment of the invention, after the pre-curing of the step S3, further includes forming a first OCR fluid glue layer in an enclosure space formed between the anti-overflow barrier and the cover plate of the step S2, and after the pre-curing of the step S6, forming a second OCR fluid glue layer in an enclosure space formed between the anti-overflow barrier and the touch panel of the step S5.

In at least one embodiment of the invention, after the pre-curing of the step S6, further includes using an UV to perform a secondary curing on the OCR fluid glue formed in the step S2 and the OCR fluid glue formed in the step S5, which the OCR fluid glue formed in the step S2 and the OCR fluid glue formed in the step S5 are quadrilaterals.

In at least one embodiment of the invention, the OLED device in the step S7 further includes a backplate, the backplane bonds to the OLED device by an optically clear adhesive (OCA).

In at least one embodiment of the invention, the backplate is a stainless metal sheet.

In at least one embodiment of the invention, after the pre-curing of the step S6, the fabricating method further includes using an UV to perform a secondary curing on the OCR fluid glue on the cover plate and the OCR fluid glue on the touch panel, and then using a dropping method to form a first OCR fluid glue layer in an enclosure space formed between the anti-overflow barrier and the cover plate of the step S2 and to form a second OCR fluid glue layer in an enclosure space formed between the anti-overflow barrier and the touch panel of the step S5.

The invention also provides a flexible display panel structure, including a cover plate; a touch panel; an organic light-emitting diode (OLED) device; and a backplate, wherein a first quadrilateral anti-overflow barrier is disposed between the cover plate and the touch panel, a first optical clear resin (OCR) fluid glue layer is filled in a space formed by the first quadrilateral anti-overflow barrier and the cover plate, and the first OCR fluid glue layer bonds the cover plate to the touch panel, wherein the first quadrilateral anti-overflow barrier is a parallelogram anti-overflow barrier, and the flexible display panel structure further includes a second quadrilateral anti-overflow barrier disposed between the touch panel and the OLED device, a second OCR fluid glue layer filled in a space formed by the second quadrilateral anti-overflow barrier and the touch panel, and the second OCR fluid glue layer bonds the touch panel to the OLED device.

In at least one embodiment of the invention, an area of the first OCR fluid glue layer is greater than an area of the second OCR fluid glue layer, and a thickness of the second OCR fluid glue layer is greater than a thickness of the first OCR fluid glue layer.

In at least one embodiment of the invention, the flexible display panel structure further including an optically clear adhesive (OCA) disposed between the OLED device and the backplane to bond the OLED device and the backplate.

In at least one embodiment of the invention, the first quadrilateral anti-overflow barrier and the second quadrilateral anti-overflow barrier are composed of an OCR fluid glue, and a thickness of the OCA ranges from 10 micrometers to 20 micrometers.

In at least one embodiment of the invention, a thickness of the first OCR fluid glue layer ranges from 3 micrometers to 5 micrometers.

Beneficial Effect

The OCR fluid glue of the present invention is used as an anti-overflow barrier, and the flexible display panel structure adopts a trapezoidal laminated structure. Thus, because of fluid advantage of the OCR fluid glue layer, on the one hand, an ultra-thin glue layer can be realized, or the OCR anti-overflow barrier and the OCR glue layer can be adjusted to any desired thickness according to level of the laminated film. On the other hand, flow characteristics of the OCR fluid glue can increase displacement between the upper and lower film layers, which reduces the shear stress and risk of peeling between the film layers.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

Figure 1:
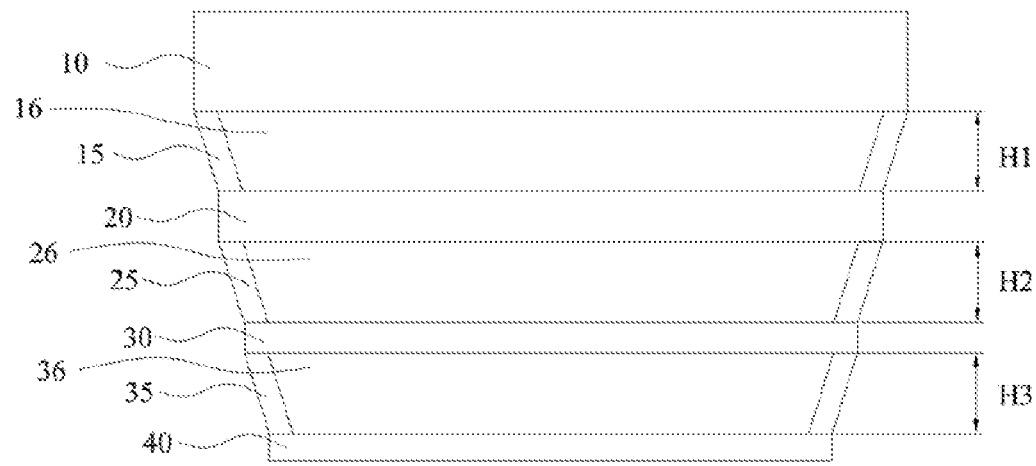
FIG. 1 is a schematic diagram of a flexible display panel structure according to an embodiment of the present invention.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The present invention is directed to flexible display panels in conventional art which functional film layers are subjected to different degrees of extrusion or stretching, so that the panel increases risk of cracking and peeling. Therefore, a flexible display panel structure and fabricating method thereof are proposed, which is beneficial to reduce risk of panel cracking and peeling. The present invention will be described in detail below with reference to specific embodiments.

Please refer to FIG. 1, where FIG. 1 is a schematic diagram of a flexible display panel structure according to an embodiment of the present invention. The flexible display panel structure includes a cover 10, a touch panel 20, and an organic light-emitting diode (OLED) device 30, and a backplane 40, which are sequentially disposed, wherein a first quadrilateral anti-overflow barrier 15 is disposed between the cover plate 10 and the touch panel 20, a first optical clear resin (OCR) fluid glue layer 16 is filled in a space formed by the first quadrilateral anti-overflow barrier 15 and the cover plate 10, and the first OCR fluid glue layer 16 bonds the cover plate 10 to the touch panel 20.

In an embodiment of the invention, the flexible display panel structure further includes a second quadrilateral anti-overflow barrier 25 disposed between the touch panel 10 and the OLED device 30, and a second OCR fluid glue layer 26 filled in a space formed by the second quadrilateral anti-overflow barrier 25 and the touch panel 20, the second OCR fluid glue layer 26 bond the touch panel 20 to the OLED device 30.

In an embodiment of the invention, the first quadrilateral anti-overflow barrier and the second quadrilateral anti-overflow barrier are composed of an OCR fluid glue, preferably the OCR fluid glue having a transmittance of more than 95% with good optical performance is selected.

The flexible display panel structure selects a trapezoidal configuration on the stacked design, that is, a length of the upper film layer is slightly greater than a length of the lower layer, thereby facilitating edges of panel to be relatively tidy after the bending. Therefore, a length of the first OCR fluid glue layer 16 is greater than a length of the second OCR fluid glue layer 26, that is, an area of the first OCR fluid glue layer 16 is greater than an area of the second OCR fluid glue layer 26. On the other hand, in consideration of the trapezoidal configuration, preferably, the thickness H2 of the second OCR fluid glue layer 26 is greater than the thickness H1 of the first OCR fluid glue layer 16. The thickness H1 of the first OCR fluid glue layer 16 adjacent to the cover 10 is relatively thin, in a range of about 3 micrometers (μm) to 5 micrometers, which is advantageous for improving hardness and scratch resistance of the flexible display panel. After the touch panel 20 is bonded, the second quadrilateral anti-overflow barrier 25 is disposed on a laminated layer including the touch panel 20, and the second OCR fluid glue layer 26 fills in the space formed by the second quadrilateral anti-overflow barrier 25 and the touch panel 20. The second OCR fluid glue layer 26 is close to the OLED device 30, and the thickness H2 of the second OCR fluid glue layer 26 is much thicker than the thickness H1 of the first OCR fluid glue layer 16. In this way, the shear stress can be reduced, and the OLED device 30 can also have a buffering effect against external impact.

In an embodiment of the invention, an optically clear adhesive (OCA) 36 is further disposed between the OLED device 30 and the backplate 40 to bond the OLED device 30 and the backplate 40 together. A thickness of the OCA 36 ranges from 10 micrometers to 20 micrometers. Since the OCR fluid glue layer is relative soft, the backplate 40 can directly adopt a stainless metal sheet having a thickness of about 30 micrometers in the stacked design, so that back support can be simultaneously performed. This can play the role of back support at the same time, and is beneficial to the structural recovery force of the flexible display panel after bending, and reduces the probability of generation of waves. Meanwhile, when the metal sheet is bonded to an array substrate of the OLED device 30, the OCA 36 having a thickness of about 15 micrometers is selected, so that the backplate 40 and the OLED device 30 are more closely bonded.

Figure 2:
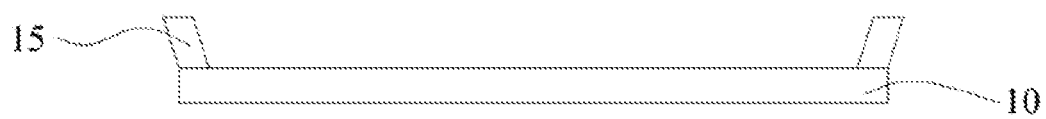
FIG. 2 is a schematic structural diagram of an anti-overflow barrier in the flexible display panel structure according to an embodiment of the present invention.
Figure 3:
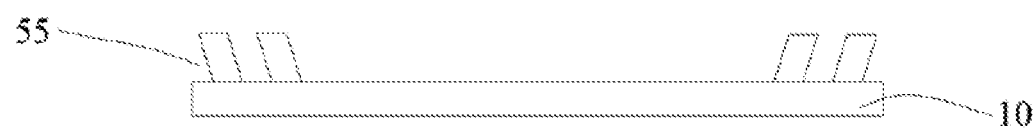
FIG. 3 is a schematic structural diagram of the anti-overflow barrier according to another embodiment of the present invention.

Referring to FIG. 2 and FIG. 3, where FIG. 2 is a schematic structural diagram of an anti-overflow barrier in the flexible display panel structure according to an embodiment of the present invention, and FIG. 3 is a schematic structural diagram of an anti-overflow barrier according to another embodiment of the present invention. FIG. 2 shows that the quadrilateral anti-overflow barrier is a single-layer structure; that is, only a circle of the quadrilateral anti-overflow barrier is arranged on the cover 10 or the touch panel 20; and FIG. 3 shows that the quadrilateral anti-overflow barrier is a double-layer structure; that is, two circles of the quadrilateral anti-overflow barrier 55 are disposed above the cover 10 or the touch panel 20. FIG. 2 and FIG. 3 are diagrams illustrating the positional relationship of number of the quadrilateral anti-overflow barriers, which are not limited thereto.

Figure 4:
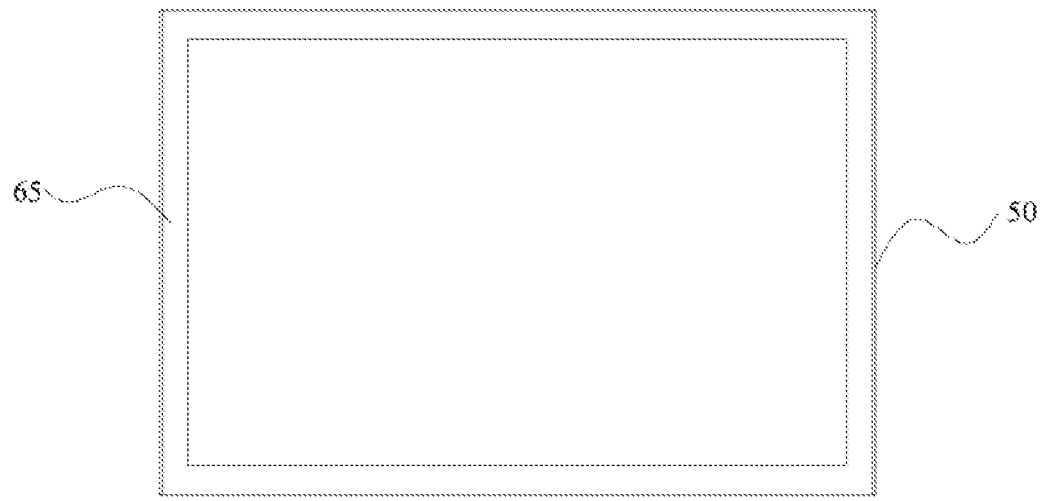
FIG. 4 is a top plane view of the anti-overflow barrier structure according to an embodiment of the present invention.
Figure 5:
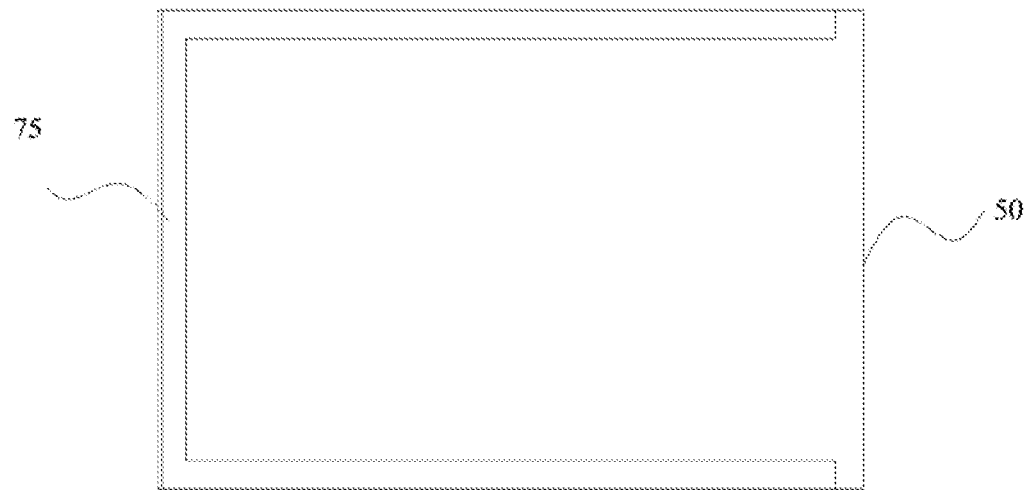
FIG. 5 is a top plane view of the anti-overflow barrier structure according to another embodiment of the present invention.

The present invention also provides a method of fabricating the flexible display panel structure. Please refer to FIG. 4, FIG. 5, and FIG. 6 simultaneously. FIG. 4 is a schematic top plane view of the anti-overflow barrier structure according to an embodiment of the present invention, FIG. 5 is a schematic top plane view of another anti-overflow barrier structure, and FIG. 6 is a schematic flowchart of a method of fabricating the flexible display panel according to an embodiment of the present invention.

Figure 6:
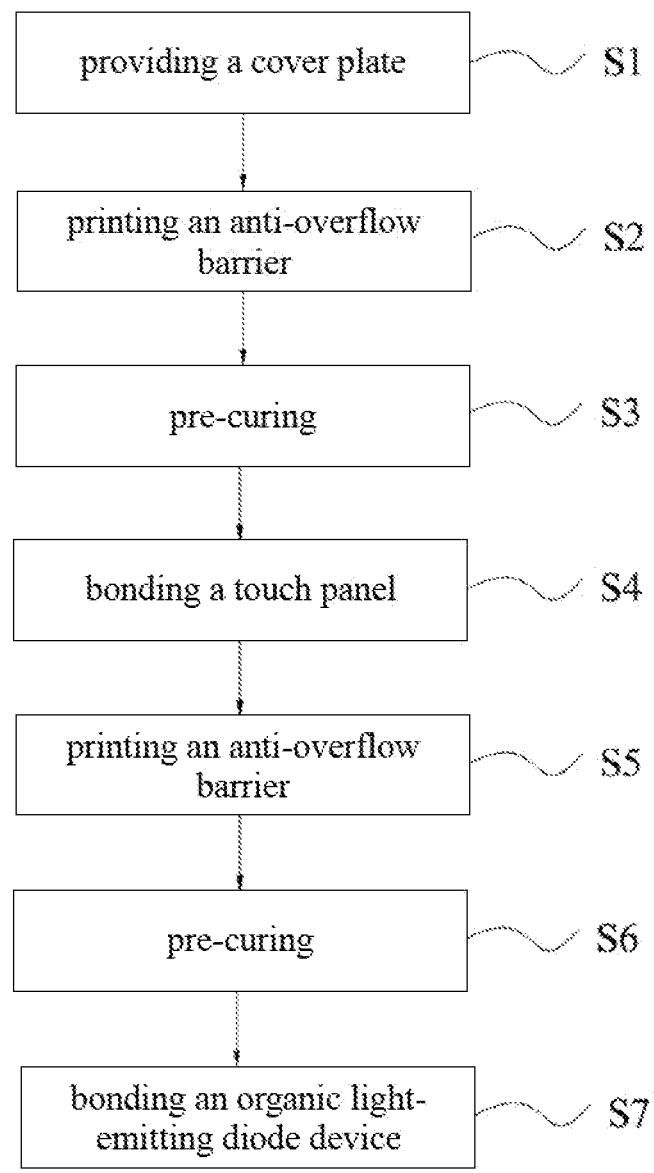
FIG. 6 is a flowchart of a method of fabricating the flexible display panel structure according to an embodiment of the present invention.

Referring to FIG. 6 and FIG. 1, the fabricating method of the flexible display panel structure includes the following steps: step S1, providing the cover plate 10; step S2, printing the anti-overflow barrier 15, which is performed by an inkjet printing on the cover plate 10, and the anti-overflow barrier 15 is the optical clear resin (OCR) fluid glue; step S3, pre-curing, which irradiates the anti-overflow barrier 15 by an ultraviolet rays (UV) to pre-cure the OCR fluid glue on the cover plate 10;

step S4, bonding the touch panel 20, which bonds the touch panel 20 to the cover plate 10 having pre-cured OCR fluid glue; step S5, printing the anti-overflow barrier 25, which is performed by an inkjet printing on the touch pane 120, and the anti-overflow barrier 25 is the OCR fluid glue; step S6, pre-curing, which irradiates the anti-overflow barrier 25 by the UV to pre-cure the OCR fluid glue on the touch panel 20; and step S7, bonding the OLED device 30, which bonds the OLED device 30 to the touch panel 20 having pre-cured OCR fluid glue.

In an embodiment of the present invention, after the pre-curing of the step S6, further includes using the UV to perform a secondary curing on the OCR fluid glue formed in the step S2 and the OCR fluid glue formed in the step S5, which the OCR fluid glue formed in the step S2 and the OCR fluid glue formed in the step S5 are quadrilaterals.

In an embodiment of the present invention, as shown in FIG. 4, after the pre-curing of the step S3, further includes forming the first OCR fluid glue layer 16 in an enclosure space formed between the anti-overflow barrier 15 and the cover plate 10 of the step S2, and after the pre-curing of the step S6, forming the second OCR fluid glue layer 26 in an enclosure space formed between the anti-overflow barrier 25 and the touch panel 20 of the step S5.

In an embodiment of the present invention, when the anti-overflow barrier is printed in steps S2 and S5, the anti-overflow barrier has an opening, as shown in the top plane view of FIG. 5, positional relationship between the anti-overflow barrier 75 and a substrate 50, and there is one side above the substrate 50 without the anti-overflow barrier 75. The substrate 50 can be the cover 10 or the touch panel 20 of FIG. 1, and the anti-overflow barrier 75 can be the corresponding anti-overflow barrier 15 or the anti-overflow barrier 25. That is, the enclosure space formed between the anti-overflow barrier 15 and the cover 10 of the step S2 has a first opening, the anti-overflow barrier 15 is the anti-overflow barrier 75 as shown in FIG. 5. The enclosure space formed between the anti-overflow barrier 25 and the touch panel 20 of the step S5 has a second opening, and the anti-overflow barrier 25 is the anti-overflow barrier 75 as shown in FIG. 5. When the anti-overflow barrier is printed in step S2 and step S5, if the anti-overflow barrier has the opening, after the pre-curing of the step S6, the fabricating method further includes using the UV to perform a secondary curing on the OCR fluid glue 15 on the cover plate 10 and the OCR fluid glue 25 on the touch panel 20, then using an injection method to form the first OCR fluid glue layer 16 in the enclosure space formed between the anti-overflow barrier 15 and the cover plate 10 of the step S2 through the first opening and to form the second OCR fluid glue layer 26 in the enclosure space formed between the anti-overflow barrier 25 and the touch panel 20 of the step S5 through the second opening, and then using the OCR as a sealant seals the first opening and the second opening and cures the sealant using UV.

In an embodiment of the invention, the OLED device 30 of step S7 further includes a backplate 40, the backplate 40 bonds to the OLED device 30 via the OCA 36.

Through the present invention utilizes that the OCR fluid glue having transmittance greater than 95% and good optical performance is selected as the anti-overflow barrier, and the flexible display panel structure adopts a trapezoidal laminated structure, so that four sides of device-to-device stack have a quadrilateral OCR fluid glue anti-overflow barrier to set the OCR fluid glue layer. Thus, because of fluid advantage of the OCR fluid glue layer, on the one hand, an ultra-thin glue layer, for example a thickness ranges from 3 micrometers to 5 micrometers, can be realized by the injection method or the dropping method, etc., or the OCR anti-overflow barrier and the OCR glue layer can be adjusted to any desired thickness according to level of the laminated film. On the other hand, flow characteristics of the OCR fluid glue can increase displacement between the upper and lower film layers, which reduces the shear stress and risk of peeling between the film layers.

Embodiments of the present invention have been described, but not intending to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A flexible display panel structure, comprising:
    a cover plate;
    a touch panel;
    an organic light-emitting diode (OLED) device;
    a backplate;
    a first quadrilateral anti-overflow barrier disposed between the cover plate and the touch panel, wherein a first optical clear resin (OCR) fluid glue layer is filled in a space formed by the first quadrilateral anti-overflow barrier and the cover plate, and the first OCR fluid glue layer bonds the cover plate to the touch panel; and
    a second quadrilateral anti-overflow barrier disposed between the touch panel and the OLED device, wherein a second OCR fluid glue layer is filled in a space formed by the second quadrilateral anti-overflow barrier and the touch panel, and the second OCR fluid glue layer bonds the touch panel to the OLED device, and
    wherein the first quadrilateral anti-overflow barrier is a parallelogram anti-overflow barrier.

2. The flexible display panel structure of claim 1, wherein an area of the first OCR fluid glue layer is greater than an area of the second OCR fluid glue layer, and a thickness of the second OCR fluid glue layer is greater than a thickness of the first OCR fluid glue layer.

3. The flexible display panel structure of claim 2, further comprising an optically clear adhesive (OCA) disposed between the OLED device and the backplane to bond the OLED device and the backplate.

4. The flexible display panel structure of claim 3, wherein the first quadrilateral anti-overflow barrier and the second quadrilateral anti-overflow barrier are composed of an OCR fluid glue.

5. The flexible display panel structure of claim 3, wherein a thickness of the OCA ranges from 10 micrometers to 20 micrometers.

6. The flexible display panel structure of claim 3, wherein a thickness of the first OCR fluid glue layer ranges from 3 micrometers to 5 micrometers.

7. The flexible display panel structure of claim 2, wherein the backing plate is a metal sheet.

8. A method of fabricating a flexible display panel structure, comprising the steps of:
    step S1, providing a cover plate;
    step S2, printing a first quadrilateral anti-overflow barrier, which is performed by an inkjet printing on the cover plate, and the first quadrilateral anti-overflow barrier is an optical clear resin (OCR) fluid glue;
    step S3, pre-curing, which irradiates the first quadrilateral anti-overflow barrier by an ultraviolet rays (UV) to pre-cure the OCR fluid glue on the cover plate;
    step S4, bonding a touch panel, which bonds the touch panel to the cover plate having pre-cured OCR fluid glue;
    step S5, printing a second quadrilateral anti-overflow barrier, which is performed by an inkjet printing on the touch panel, and the second quadrilateral anti-overflow barrier is an OCR fluid glue;
    step S6, pre-curing, which irradiates the second quadrilateral anti-overflow barrier by the UV to pre-cure the OCR fluid glue on the touch panel;
    step S7, bonding an organic light-emitting diode (OLED) device, which bonds the OLED device to the touch panel having pre-cured OCR fluid glue;
    wherein after the pre-curing of the step S3, forming a first OCR fluid glue layer in an enclosure space formed between the first quadrilateral anti-overflow barrier and the cover plate; and after the pre-curing of the step S6, forming a second OCR fluid glue layer in an enclosure space formed between the second quadrilateral anti-overflow barrier and the touch panel in the step S5; and
    wherein the first quadrilateral anti-overflow barrier is a parallelogram anti-overflow barrier, and the second quadrilateral anti-overflow barrier is disposed between the touch panel and the OLED device, the second OCR fluid glue layer bonds the touch panel to the OLED device.

9. The fabricating method of claim 8, wherein after the pre-curing of the step S6, further comprises using an UV to perform a secondary curing on the OCR fluid glue formed in the step S2 and the OCR fluid glue formed in the step S5.

10. The fabrication method of claim 8, wherein the OLED device in the step S7 further comprises a backplate, the backplane bonds to the OLED device by an optically clear adhesive (OCA).

11. The fabricating method of claim 10, wherein the backplate is a stainless metal sheet.

12. The fabricating method of claim 8, wherein after the pre-curing of the step S6, the fabricating method further comprises using an UV to perform a secondary curing on the OCR fluid glue on the cover plate and the OCR fluid glue on the touch panel, and then using a dropping method to form the first OCR fluid glue layer in the enclosure space formed between the first quadrilateral anti-overflow barrier and the cover plate of the step S2 and to form the second OCR fluid glue layer in the enclosure space formed between the second quadrilateral anti-overflow barrier and the touch panel of the step S5.

\* \* \* \* \*